United States Patent
Kanskar

(10) Patent No.: US 9,166,368 B2
(45) Date of Patent: Oct. 20, 2015

(54) HIGH POWER SEMICONDUCTOR LASER WITH PHASE-MATCHING OPTICAL ELEMENT

(71) Applicant: Manoj Kanskar, Portland, OR (US)

(72) Inventor: Manoj Kanskar, Portland, OR (US)

(73) Assignee: nLight Photonics Corporation, Vancouver, WA (US)

( * ) Notice: Subject to any disclaimer, the term of this patent is extended or adjusted under 35 U.S.C. 154(b) by 18 days.

(21) Appl. No.: 13/624,537

(22) Filed: Sep. 21, 2012

(65) Prior Publication Data

US 2013/0089115 A1 Apr. 11, 2013

Related U.S. Application Data

(60) Provisional application No. 61/545,635, filed on Oct. 11, 2011.

(51) Int. Cl.
*H01S 5/10* (2006.01)
*H01S 5/12* (2006.01)
*H01S 5/028* (2006.01)
*H01S 5/22* (2006.01)

(52) U.S. Cl.
CPC ............. *H01S 5/1014* (2013.01); *H01S 5/12* (2013.01); *H01S 5/0287* (2013.01); *H01S 5/1085* (2013.01); *H01S 5/1203* (2013.01); *H01S 5/22* (2013.01); *H01S 2301/166* (2013.01)

(58) Field of Classification Search
CPC . H01S 5/0654; H01S 5/06246; H01S 5/0624; H01S 5/22–5/2277; H01S 2301/163; H01S 2301/185
USPC .................... 372/50.11, 45.01, 50.23
See application file for complete search history.

(56) References Cited

U.S. PATENT DOCUMENTS

| | | | | |
|---|---|---|---|---|
| 4,856,017 A | * | 8/1989 | Ungar | 372/96 |
| 4,977,567 A | * | 12/1990 | Hanke | 372/45.01 |
| 5,003,550 A | | 3/1991 | Welch et al. | |
| 5,228,049 A | * | 7/1993 | Paoli | 372/50.22 |
| 5,499,261 A | | 3/1996 | Welch et al. | |
| 5,539,571 A | * | 7/1996 | Welch et al. | 359/344 |
| 5,602,864 A | | 2/1997 | Welch et al. | |
| 5,794,839 A | * | 8/1998 | Kimura et al. | 228/123.1 |

(Continued)

OTHER PUBLICATIONS

Larsson et al., "Grating Coupled Surface Emitters: Integrated Lasers, Amplifiers, and Beam Shaping Outcouplers," Jan. 1999, SPIE Conference on Testing, Packaging, and Reliability of Semiconductor Lasers IV, vol. 3626, 190-201.*

(Continued)

*Primary Examiner* — Joshua King
(74) *Attorney, Agent, or Firm* — Patent Law Office of David G. Beck

(57) ABSTRACT

A semiconductor laser that includes a single mode semiconductor laser coupled to a flared power amplifier is provided, the device including an internal or an external optical element that reinforces the curved wave front of the flared section of the device through phase-matching. By reinforcing the curved wave front via phase-matching, the device is less susceptible to thermal and gain-index coupled perturbations, even at high output powers, resulting in higher beam quality. Exemplary phase-matching optical elements include a grating integrated into the flared amplifier section; an intra-cavity, externally positioned binary optical element; and an intra-cavity, externally positioned cylindrically curved optical element.

15 Claims, 6 Drawing Sheets

(56) References Cited

U.S. PATENT DOCUMENTS

| | | | |
|---|---|---|---|
| 6,130,903 A * | 10/2000 | Moloney et al. | 372/50.22 |
| 6,148,013 A * | 11/2000 | Geels et al. | 372/46.01 |
| 6,174,748 B1 * | 1/2001 | Jeon et al. | 438/31 |
| 6,301,037 B1 * | 10/2001 | Fischer et al. | 398/201 |
| 6,525,872 B1 | 2/2003 | Ziari et al. | |
| 6,798,815 B2 | 9/2004 | Schmidt et al. | |
| 6,810,054 B2 * | 10/2004 | Sousa et al. | 372/45.01 |
| 7,245,803 B2 * | 7/2007 | Gunn et al. | 385/37 |
| 2002/0105718 A1 * | 8/2002 | Bacher et al. | 359/334 |
| 2002/0181525 A1 | 12/2002 | Kasukawa | |
| 2003/0219054 A1 * | 11/2003 | Capasso et al. | 372/50 |
| 2005/0013337 A1 * | 1/2005 | Jung et al. | 372/50 |
| 2006/0023173 A1 * | 2/2006 | Mooradian et al. | 353/94 |
| 2008/0112450 A1 * | 5/2008 | Krakowski | 372/45.01 |
| 2008/0212632 A1 * | 9/2008 | Eberhard et al. | 372/45.01 |

OTHER PUBLICATIONS

H. Wenzel et al., High-Brightness Diode Lasers, C.R. Physique, Mar. 2003, pp. 649-661, vol. 4, Elsevier.

B. Sumpf et al., High-Brightness Quantum Well Tapered Lasers, IEEE J. of Selected Topics in Quantum Electronics, May/Jun. 2009, pp. 1009-1020, vol. 15, No. 3, IEEE.

J.N. Walpole, Semiconductor Amplifiers and Lasers with Tapered Gain Regions, Optical and Quantum Electronics, 1996, pp. 623-645, vol. 28, Chapman & Hall.

B. Sumpf et al., 1060 nm DBR Tapered Lasers with 12 W Output Power and a Nearly Diffraction Limited Beam Quality, Proc. of SPIE, 2009, pp. 72301E1-72301E-8, vol. 7230, SPIE.

H. Odriozola et al., Design of 1060 nm Tapered Lasers with Separate Contacts, Opt. Quant. Electron., 2008, pp. 1123-1127, vol. 40, Springer.

\* cited by examiner

HIGH POWER SEMICONDUCTOR LASER WITH PHASE-MATCHING OPTICAL ELEMENT

CROSS-REFERENCE TO RELATED APPLICATION

This application claims the benefit of U.S. Provisional Patent Application Ser. No. 61/545,635, filed 11 Oct. 2011, the disclosure of which is incorporated herein by reference for any and all purposes.

FIELD OF THE INVENTION

The present invention relates generally to semiconductor lasers and, more particularly, to a flared semiconductor laser design that simultaneously achieves high output power with limited beam degradation in the lateral direction.

BACKGROUND OF THE INVENTION

Semiconductor lasers may utilize any of a variety of different designs, the selected design typically driven by the requirements of the intended application. Unfortunately it is often difficult to find a device design that meets all of a specific application's requirements since many times one device characteristic, such as output power, may influence another device characteristic, such as beam quality. For example, ridge-waveguide (RW) lasers offer nearly diffraction limited beam quality but are only able to achieve output powers of approximately 1 watt. Conversely, broad-area lasers are able to reach high output powers, on the order of 20 watts, but suffer from poor beam quality.

One approach that has been investigated recently as a means of achieving both high output power and acceptable beam quality is the use of a master oscillator with a power amplifier (MOPA). In this type of system, the output from a single mode laser is injected into a power amplifier. These two components may be separate or combined on to a single device, the latter approach eliminating many of the alignment difficulties associated with the former approach.

FIGS. 1 and 2 illustrate a conventional flared semiconductor laser integrated on to a single substrate, this structure utilizing two separate electrical contacts. FIG. 1 provides a perspective view while FIG. 2 provides a top view of the same device 100. Semiconductor laser 100 is comprised of two components; a single mode ridge waveguide (RW) laser 101 that is coupled at one end to a high power flared section 103. RW 101 may be either a gain-guided structure or an index-guided structure. The non-coupled end surface 105 of RW 101 is typically coated with a high reflectivity (HR) coating. Alternately, RW 101 may utilize a distributed Bragg reflector (DBR) or a distributed feedback (DFB) section in which case surface 105 is coated with an anti-reflection (AR) coating. The outer, flared edge 107 of section 103 is typically coated with an AR coating.

To date, high power broad area lasers with a 100 µm aperture have been limited to around 10-15 watts of power with a beam quality factor, $M^2$, of 1 in the transverse direction and an $M^2$ of 15 (beam parameter product (BPP) of approximately 17 mm-mrad) in the lateral direction. In the recent past, tapered lasers utilizing the design shown in FIGS. 1 and 2 have shown higher beam quality than non-tapered broad area lasers, achieving a beam propagation ratio, $M^2$, of 1.2 at output powers of up to about 5 watts in continuous (CW) operation. However, at higher output powers the beam quality in the lateral direction begins to experience degradation. This degradation is due to phase front distortion arising from optical feedback and subsequent gain-index coupling. Additionally, at high output power beam quality degradation in this type of laser can be caused by thermal gradient-induced index of refraction variations.

Accordingly, what is needed is a means for reducing beam quality degradation at high output powers in semiconductor lasers utilizing a tapered design. The device structure of the present invention achieves these goals.

SUMMARY OF THE INVENTION

A semiconductor laser that includes a single mode (SM) semiconductor laser section coupled to a flared power amplifier is provided, the device including an optical element configured to reinforce the curved wave front of the output beam of the flared section through phase-matching. In one configuration, the optical element is comprised of a curved grating integrated into the flared section of the device, where the curvature corresponding to the curved grating matches the phase and curvature of the curved wave front of the output beam of the flared section. In an alternate configuration, the optical element is comprised of an intra-cavity optical element that is external to the SM semiconductor laser and flared sections and which is comprised of a binary optical element that is phase matched with the curved wave front of the output beam of the flared section. In yet another alternate configuration, the optical element is comprised of an intra-cavity optical element that is external to the SM semiconductor laser and flared sections and which is comprised of a cylindrically curved optical element with a curvature that matches the phase and curvature of the curved wave front of the output beam of the flared section. In those configurations using an external optical element to reinforce the wave front of the output beam of the flared section, a fast-axis collimating lens is preferably interposed between the output surface of the flared section and the external optical element. In those configurations using an external optical element to reinforce the wave front of the output beam of the flared section, the output surface of the optical element may be coated with a partially reflective broadband coating.

In one aspect of the invention, the rear facet of the SM semiconductor laser section may be coated with a high reflectivity coating (e.g., at least 90%). In another aspect, the front facet of the flared section may be coated with an anti-reflection (AR) coating and/or tilted at an angle θ away from the normal, where angle θ is greater than or equal to the critical angle $θ_{critical}$ which corresponds to the angle required to suppress reflections from the front facet into the flared section. In another aspect, the output coupler of the device may consist of an optical element coated with a partially reflective broadband coating; alternately, may consist of a wavelength selective surface grating; alternately, may consist of a wavelength selective volume Bragg grating. The SM semiconductor laser section may be configured as a distributed feedback (DFB) laser or a distributed Bragg reflector (DBR) laser. In another aspect, the SM semiconductor laser section may have a width of between 3 µm and 7.5 µm, and the flared section may have a length of between 2 millimeters and 10 millimeters. The active region of the flared section may be comprised of a quantum well gain media or a quantum dot gain media. A Ti-Schottky contact layer may be located outside the current-injected region of the flared region to attenuate the propagating beam and severely reduce reflection from the sides to prevent beam quality degradation.

A further understanding of the nature and advantages of the present invention may be realized by reference to the remaining portions of the specification and the drawings.

DESCRIPTION OF THE SPECIFIC EMBODIMENTS

In accordance with the invention, the beam quality of a tapered, i.e., flared, semiconductor laser is improved by providing a tailored, curved wave front into the unstable resonator. The inventor has found that with such a curved wave front in the flared section of the device, the device becomes less susceptible to thermal and gain-index coupled perturbations even at high output powers, e.g., greater than 5 watts. Accordingly, the present invention introduces phase-matching features into the system so that the wave-front curvature dominates the filaments introduced by the spatio-temporal chaos inside the resonator, thereby preventing beam quality degradation.

Figure 1:
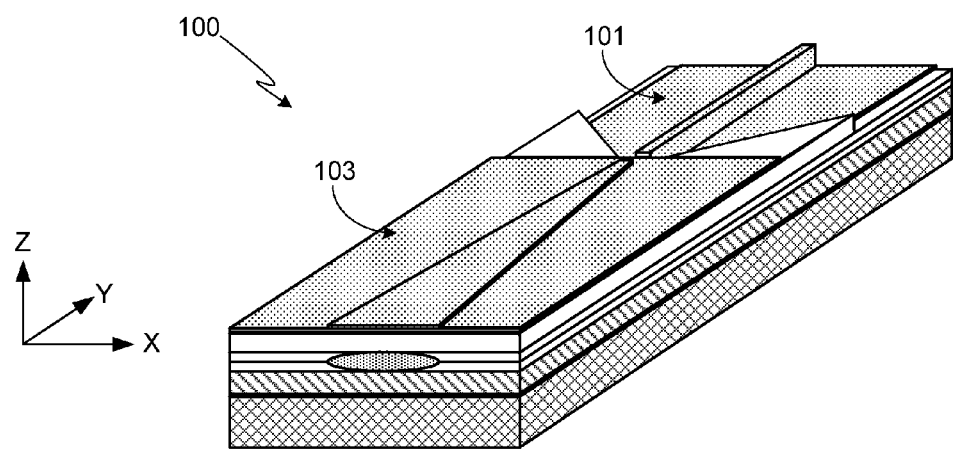
FIG. 1 provides a schematic of a flared semiconductor laser with two separate electrical contacts in accordance with the prior art.
Figure 2:
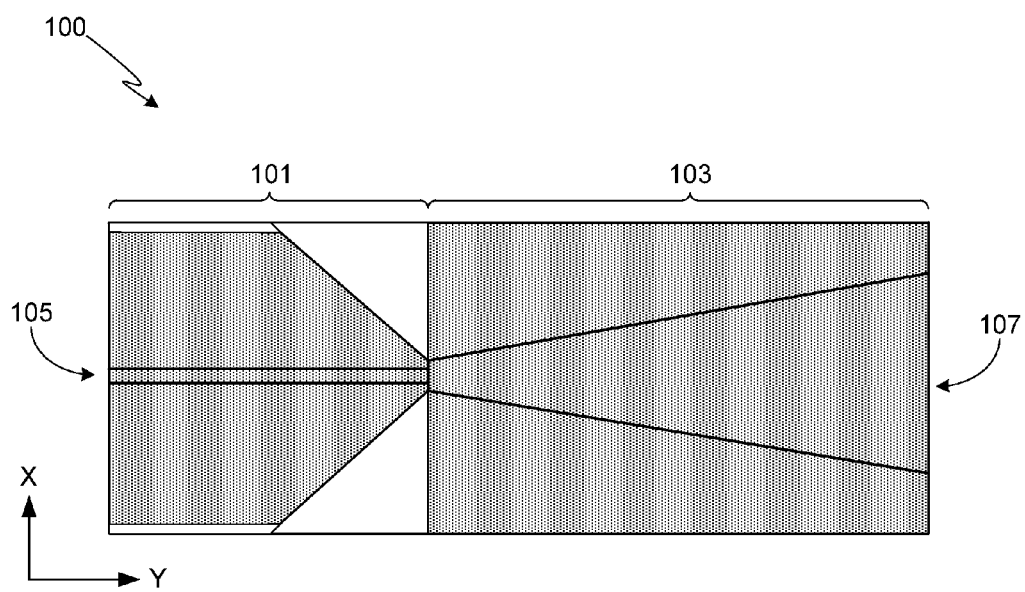
FIG. 2 provides a top view of the flared semiconductor laser of FIG. 1, this view showing both the ridge waveguide and the high power flared sections.
Figure 3:
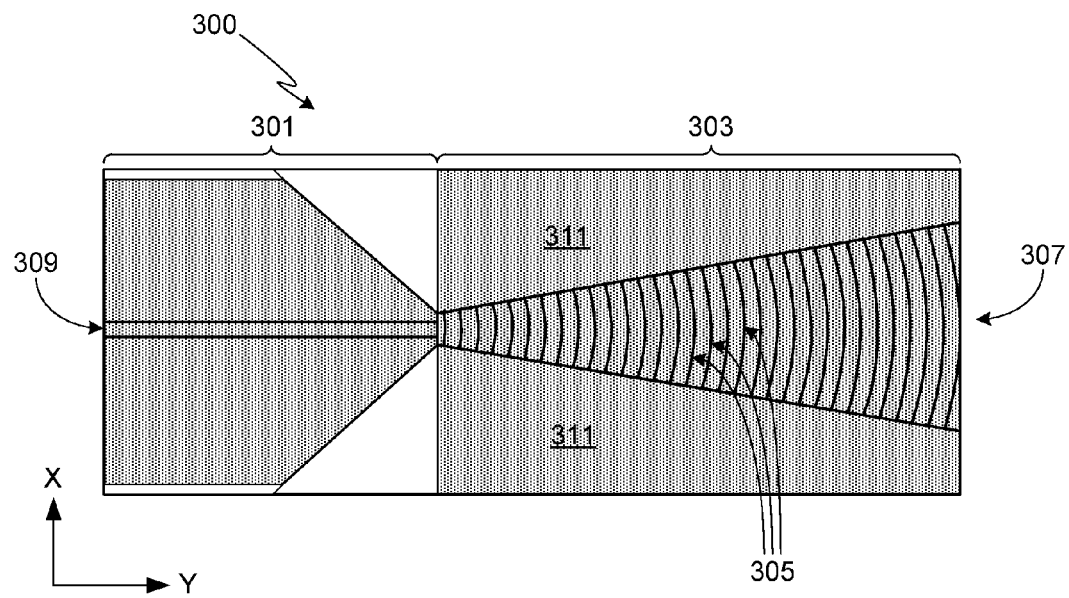
FIG. 3 illustrates a flared semiconductor laser, such as the laser shown in FIGS. 1 and 2, with the inclusion of a phase-matching curved grating integrated monolithically into the device in accordance with an embodiment of the invention.

FIG. 3 illustrates a preferred embodiment of the invention based on the MOPA configuration shown in FIGS. 1 and 2 in which a single mode RW laser 301 drives a gain- or index-guided flared power amplifier section 303. In this embodiment, integrated into flared section 303 of device 300 is a curved grating 305. This curved grating is defined as modulation in index of refraction that is periodic with a periodicity of $\Lambda(x,y)=m\lambda/2n_{eff}$, where m is the order of the grating, $\lambda$ is the Bragg wavelength and $n_{eff}$ is the effective index of the optical mode. $\Lambda(x,y)$ defines a grating pitch function in the x- and y-planes as defined in FIG. 2. The most general function of this pitch is defined by a radius of curvature to the grating, $R(x, y)=\Sigma_{m,n}{}^{l}c_{m,n}x^{m}y^{n}$. The origin of this function resides at the point where a vertical line that divides the RW and flared amplifier crosses the line that symmetrically bifurcates the device in the longitudinal direction (y-direction) in FIG. 2. The curvature of grating 305 is configured to match the phase and curvature of the beam propagating through power amplifier 303 by choosing the required number of terms in the bipolynomial function, R(x,y). The inventor has found that curved grating 303 not only helps to maintain a uniform wave front, as determined by the grating's curvature, but also helps to push out any filaments and prevent self-focusing.

Figure 4:
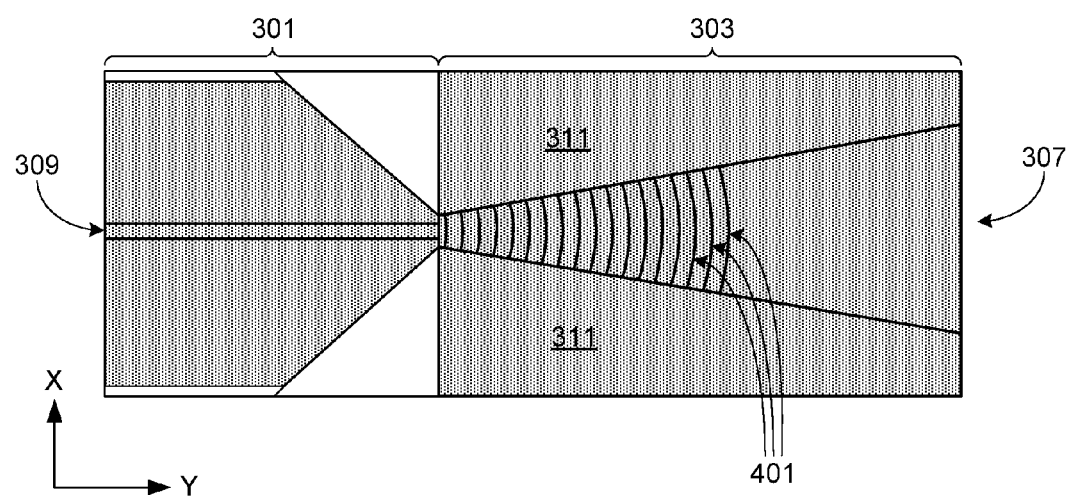
FIG. 4 illustrates a flared semiconductor laser, similar to that shown in FIG. 3, in which the phase-matching curved grating only occupies a portion of the flared power amplifier section.

It should be understood that it is not necessary for the curved grating 305 to occupy the entire length of the flared power amplifier section 303. This configuration is illustrated in FIG. 4 in which curved grating 401 is located at the input end of flared power amplifier section 303. The actual length of the curved grating 401 depends on the specific waveguide design of the single mode RW laser 301 as well as the length and lateral waveguide design of the flared power amplifier section 303. Typically the length of the grating, L, is chosen so that the product of the grating coupling constant, k, and the grating length, i.e., k×L, has a value in the range of 0.01 to 2.0.

Figure 5:
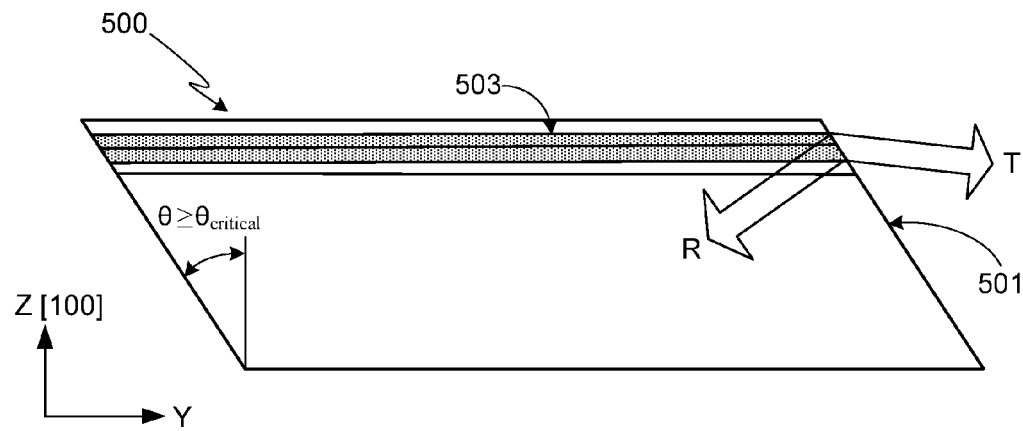
FIG. 5 provides a longitudinal cross-sectional view of a flared semiconductor laser, such as the lasers shown in FIGS. 3 and 4, in which the front facet is tilted to suppress back reflections into the planar waveguide.

In order to suppress facet feedback from surface 307, preferably front facet 307 is coated with an AR coating. Alternately, or in combination with an AR coating as preferred, the front facet of the flared section may be tilted in the epitaxial growth direction. In this embodiment, the laser structure is grown on a substrate that is oriented at an angle away from the principle growth axis so that the cleaved facets are tilted with respect to the wave propagation direction. By tilting the front facet, any residual reflections, R, are deflected away from the facet and away from the waveguide as shown in FIG. 5. In device 500, front facet 501 is tilted at an angle $\theta$ that is greater than $\theta_{critical}$, where $\theta_{critical}$ is the critical angle required to suppress feedback (i.e., reflections R) back into the planar optical waveguide 503. As previously noted, preferably surface 501 is AR coated in order to further suppress reflections back into the waveguide.

Figure 6:
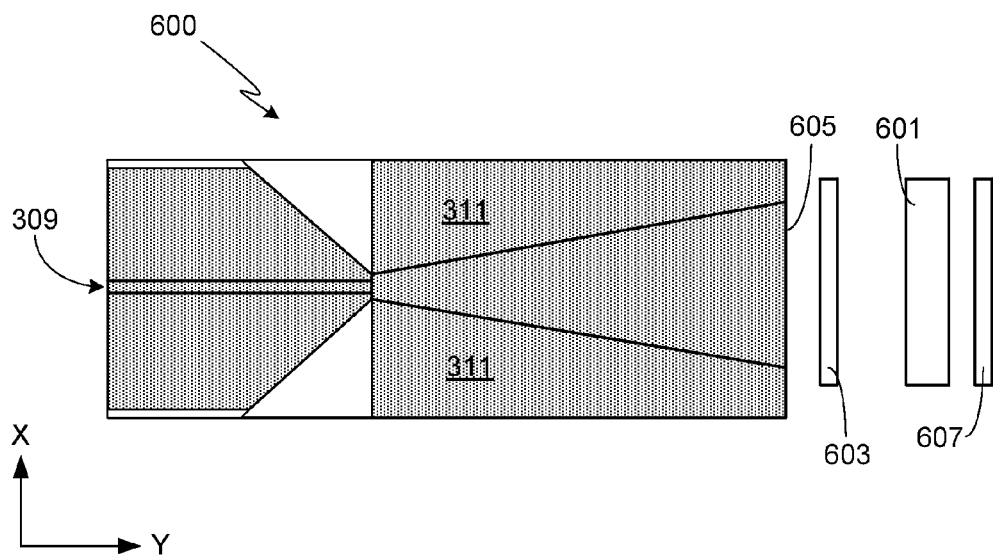
FIG. 6 provides a top view of a flared semiconductor laser, such as the laser shown in FIGS. 1 and 2, with the inclusion of a phase-matching binary optical element interposed between the output facet of the laser and the output coupler.

In another embodiment, an intra-cavity, external phase-matching optical element is used to maintain a smooth wave front and achieve improved beam quality. FIG. 6 illustrates an embodiment based on the device shown in FIGS. 1 and 2 that includes a phase matching binary optical element 601. As is known by those of skill in the art, a binary optical element is one in which surface relief structures have been etched into the optical element's substrate, typically using integrated circuit fabrication techniques. In the present application, binary optical element 601 is configured to provide phase matching with the wave front of the device's output, thereby providing the desired feedback necessary to reinforce the curved wave front of the flared power amplifier section.

Figure 7:
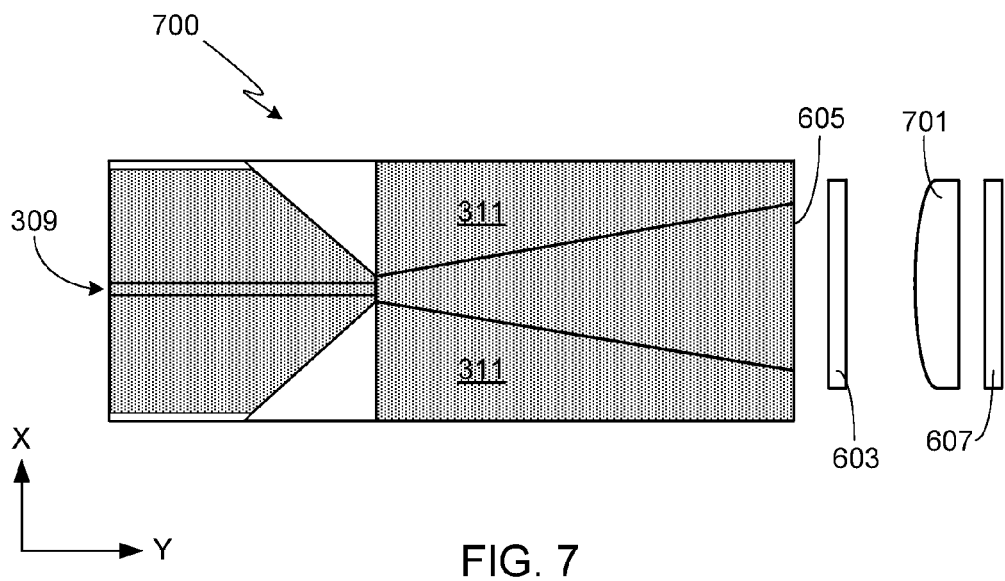
FIG. 7 provides a top view of a flared semiconductor laser, such as the laser shown in FIGS. 1 and 2, with the inclusion of a phase-matching cylindrical optical element interposed between the output facet of the laser and the output coupler.

FIG. 7 illustrates a variation of the system shown in FIG. 6, this embodiment replacing binary optical element 601 with a cylindrically curved optical element 701. The curvature of element 701 matches the wave front of the tapered power amplifier section, thus feeding back the wave front generated inside the flared section and making the device less susceptible to thermal and gain-index coupled perturbations.

Preferably and as shown, in devices 600 and 700 a fast-axis collimating lens 603 is interposed between the output surface 605 and the phase matching optical element. Surface 605 is preferably AR coated to reduce facet feedback. Alternately, and as described above, surface 605 may be tilted, or tilted and AR coated, with respect to the wave propagation direction.

The output coupler 607 can be in the form of a partially reflecting broadband coating applied to the phase matching optical element, e.g., element 601 or 701, or applied to a separate optical element. Output coupler 607 may also be comprised of a wavelength-selective partially reflecting element such as a surface grating or a volume Bragg grating (VBG). If a wavelength-selective element is used as the output coupler, preferably the center wavelength is chosen to be resonant or blue-shifted relative to the peak of the gain spectrum at the operating condition, thus achieving high differential gain and low alpha-parameter in the amplifier section. This can be achieved by blue-shifting the RW section by impurity-free vacancy disordering or impurity-induced vacancy disordering or through the use of a tuned distributed feedback (DFB) or distributed Bragg reflector (DBR).

In the embodiments described above, the rear facet 309 of the RW oscillator is coated with a high-reflectivity coating, typically with a reflectivity of at least 90%. Alternately, the rear facet 309 of these structures can be coated with an AR coating and a DBR can be used as the rear mirror for the cavity.

In accordance with the invention, the single mode semiconductor laser coupled to the flared section of the device may be configured in a variety of ways. For example, the single mode laser may be an RW oscillator configured as a distributed feedback (DFB) laser or a distributed Bragg reflector (DBR) laser. The design of RW section strongly determines the properties of the whole device. As such, preferably the RW oscillator only supports the fundamental guided mode while suppressing higher order modes generated in the tapered section. Preferably RW is fabricated by dry etching in order to minimize scattering losses. The etched surface is covered with an insulator with a contact opening to the $p^{++}$ layer in order to inject current into the RW. Depending on the vertical structure, the width of the RWG will vary between 3 μm and 7.5 μm. The length of RW section is selected to effectively suppress the higher order modes. Other configurations for the single mode laser include, but are not limited to, buried RW lasers, antiresonant reflective optical waveguide (ARROW) lasers and simplified-ARROW (S-ARROW) lasers.

In a typical configuration of the invention, the length of the flared power amplifier is on the order of 2 to 10 millimeters. In general the length of this region is selected to achieve the desired output power. Longer devices offer the advantage of a wider output aperture with a lower facet power density as well as lower thermal resistance.

Figure 8:
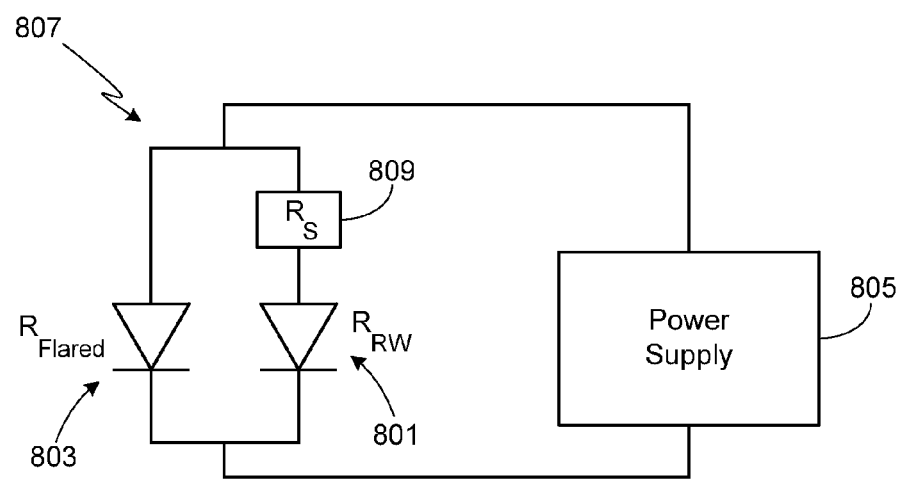
FIG. 8 schematically illustrates a current divider that may be used with the invention, enabling a single current source to drive both the ridge waveguide and the high power flared sections.

As previously noted, and in accordance with the invention, separate electrical contacts are used for the RW and flared sections of the device, thereby allowing separate control of the two sections. In a preferred embodiment, the current injected into the RW section 801 is in the range of 0.1 A to 3 A while a higher current, in the range of 3 A to 50 A, is used in the flared section 803. In order to avoid using two separate current supplies, a single current source 805 and a current divider circuit 807 such as that shown in FIG. 8 may be used. Note that in the illustrated current divider circuit 807, $R_{Flared}$ and $R_{RW}$ correspond to the series resistance of the flared and ridge-waveguide sections, respectively, and $R_s$ 809 corresponds to the resistor used to divide the current between the flared and the RWG sections. Such a current divider can be achieved by depositing additional conductive material such as TiN to attain the required resistance in the RW section.

It will be appreciated that the flared semiconductor laser used with the present invention may be configured in various ways, as described above, and may be based on a variety of different material systems and utilize various compositions and layer thicknesses, depending on the intended emission wavelength. In general, however, all of the embodiments utilize a flared semiconductor laser in which the active region consists of a quantum well or quantum dot gain media with single or multiple quantum wells or quantum dot layers. An extremely low optical confinement factor in the gain media layer is preferred in order to achieve a very low modal gain epitaxial structure.

Figure 9:
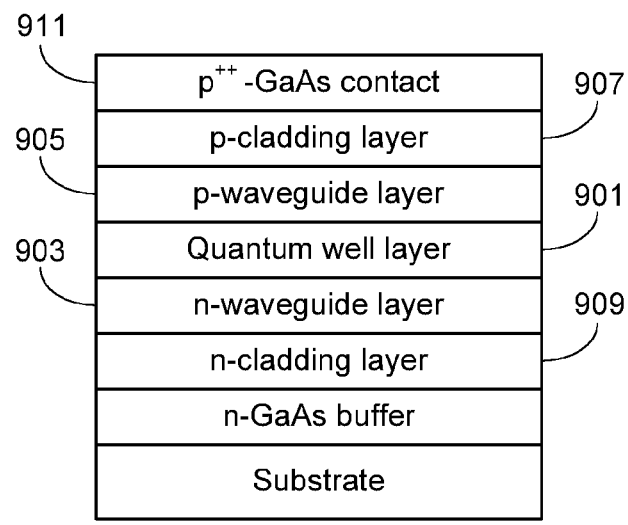
FIG. 9 provides an exemplary vertical epitaxial layer structure of a flared high power semiconductor laser that may be used with the invention.
Figure 10:
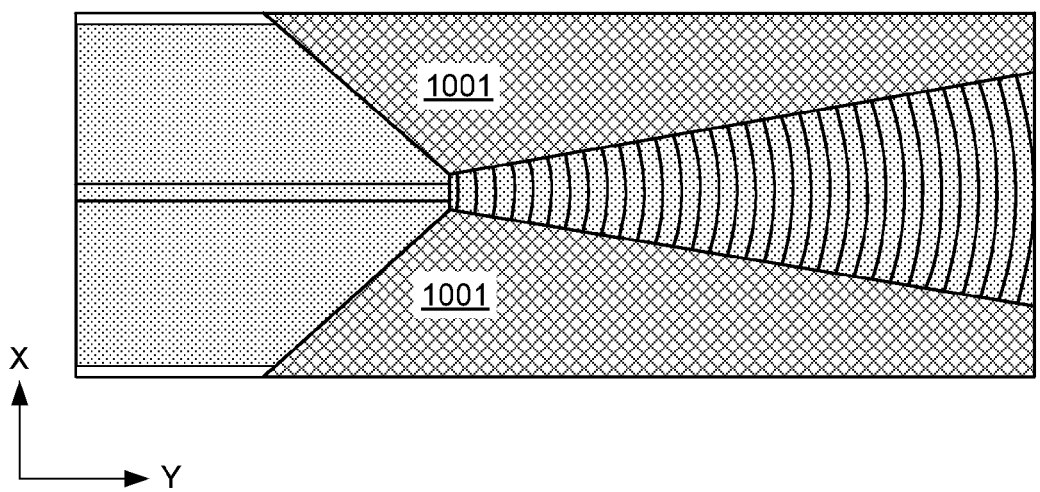
FIG. 10 illustrates an embodiment of the invention similar to that shown in FIG. 3 with an extended absorber region.
Figure 11:
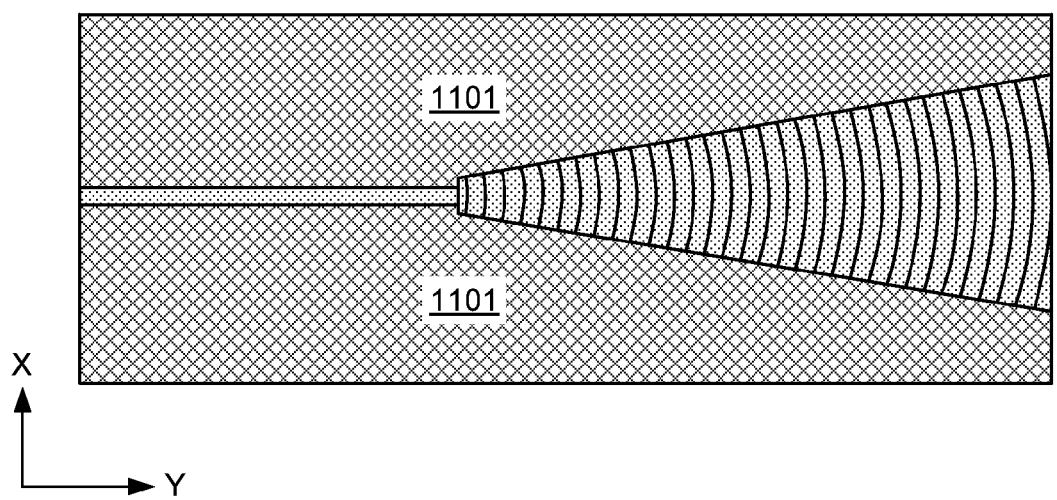
FIG. 11 illustrates an embodiment of the invention similar to that shown in FIG. 10 in which the absorber region is further extended.

FIG. 9 provides an exemplary structure, preferably fabricated using metal-organic vapor phase epitaxial growth techniques. The gain media in active layer 901 is embedded between waveguide layers 903 and 905, each of which is relatively thick. Due to this design, the power density at the front fact is reduced, thereby enabling higher optical output powers to be achieved. Additionally, the reduced vertical far field angles allow the application of optical elements with moderate numerical aperture for beam shaping. The structure is completed with p- and n-cladding layers 907 and 909, respectively, and a highly doped $p^{++}$GaAs contact layer 911. Preferably a Ti-Schottky contact layer is patterned in the flared section on either side of the current-injected section, i.e., regions 311, in order to absorb stray reflected light and further suppress interference, amplification and generation of filaments. It will be appreciated that this absorber region 311 may be extended further than shown in FIGS. 3, 4, 6 and 7. For example, FIGS. 10 and 11 illustrate embodiments based on the configuration shown in FIG. 3 in which the absorber region has been extended, i.e., region 1001 in FIG. 10 and region 1101 in FIG. 11. It will be appreciated that extended absorber regions may also be used with the embodiments shown in FIGS. 3, 6 and 7.

It should be understood that the accompanying figures are only meant to illustrate, not limit, the scope of the invention and should not be considered to be to scale.

Systems and methods have been described in general terms as an aid to understanding details of the invention. In some instances, well-known structures, materials, and/or operations have not been specifically shown or described in detail to avoid obscuring aspects of the invention. In other instances, specific details have been given in order to provide a thorough understanding of the invention. One skilled in the relevant art will recognize that the invention may be embodied in other specific forms, for example to adapt to a particular system or apparatus or situation or material or component, without departing from the spirit or essential characteristics thereof. Therefore the disclosures and descriptions herein are intended to be illustrative, but not limiting, of the scope of the invention.

What is claimed is:

1. A semiconductor laser, comprising:
    a single mode (SM) semiconductor laser section;
    a flared power amplifier section, wherein an SM output from said SM semiconductor laser section is injected into said flared power amplifier section, and wherein an output beam from said flared power amplifier section is comprised of a curved wave front; and
    a curved grating integrated throughout said flared power amplifier section and configured to reinforce said curved wave front of said output beam of said flared power amplifier section, wherein said curved grating occupies an entire length of said flared power amplifier section, wherein a curvature corresponding to said curved grating matches a phase and a curvature corresponding to said curved wave front of said output beam of said flared power amplifier section.

2. The semiconductor laser of claim 1, said SM semiconductor laser section further comprising a rear facet coated with a high reflectivity coating with a reflectivity of at least 90%.

3. The semiconductor laser of claim 1, said flared power amplifier section further comprising a front facet coated with an anti-reflection (AR) coating.

4. The semiconductor laser of claim 1, said flared power amplifier section further comprising a front facet, said front facet tilted at an angle θ away from a normal of the longitudinal axis of said semiconductor laser, wherein said angle θ is greater than or equal to a critical angle $\theta_{critical}$, wherein critical angle $\theta_{critical}$ corresponds to the angle required to suppress reflections from said front facet into said flared power amplifier section.

5. The semiconductor laser of claim 4, wherein said front facet is coated with an anti-reflection (AR) coating.

6. The semiconductor laser of claim 1, further comprising an output coupler coated with a partially reflective broadband coating.

7. The semiconductor laser of claim 1, further comprising an output coupler, said output coupler comprised of a wavelength selective surface grating.

8. The semiconductor laser of claim 1, further comprising an output coupler, said output coupler comprised of a wavelength selective volume Bragg grating (VBG).

9. The semiconductor laser of claim 1, wherein said SM semiconductor laser section is configured as a distributed feedback (DFB) laser.

10. The semiconductor laser of claim 1, wherein said SM semiconductor laser section is configured as a distributed Bragg reflector (DBR) laser.

11. The semiconductor laser of claim 1, wherein a width corresponding to said SM semiconductor laser section is between 3 μm and 7.5 μm, and wherein a length corresponding to said flared section is between 2 millimeters and 10 millimeters.

12. The semiconductor laser of claim 1, said flared power amplifier section comprising an active region consisting of a quantum well gain media.

13. The semiconductor laser of claim 1, said flared power amplifier section comprising an active region consisting of a quantum dot gain media.

14. The semiconductor laser of claim 1, said flared power amplifier section comprising a current-injected region, a first Schottky contact comprised of a first titanium layer located on a first side of said current-injected region, and a second Schottky contact comprised of a second titanium layer located on a second side of said current-injected region.

15. The semiconductor laser of claim 14, said first Schottky contact additionally located on a first side of said SM semiconductor laser section, and said second Schottky contact additionally located on a second side of said SM semiconductor laser section.

* * * * *